(12) United States Patent
Okada et al.

(10) Patent No.: US 8,405,125 B2
(45) Date of Patent: Mar. 26, 2013

(54) SEMICONDUCTOR DEVICE AND METHOD FOR PRODUCING THE SAME

(75) Inventors: Masaya Okada, Osaka (JP); Makoto Kiyama, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 43 days.

(21) Appl. No.: 12/966,306

(22) Filed: Dec. 13, 2010

(65) Prior Publication Data

US 2011/0156050 A1    Jun. 30, 2011

(30) Foreign Application Priority Data

Dec. 28, 2009  (JP) ................................. 2009-297752

(51) Int. Cl.
  *H01L 29/66*  (2006.01)
  *H01L 21/338*  (2006.01)
(52) U.S. Cl. ................. 257/194; 438/173; 257/E29.246; 257/E21.403
(58) Field of Classification Search ........... 257/E21.403, 257/E21.407, 76, E29.255, 330, 331, 332, 257/192, E29.247, E29.245, E29.246, 329, 257/E29.252, E29.253, E29.26, 194; 438/98, 438/186, 167, 172, 173
See application file for complete search history.

(56) References Cited

U.S. PATENT DOCUMENTS

| | | | | |
|---|---|---|---|---|
| 5,313,088 | A * | 5/1994 | Takahashi et al. | 257/328 |
| 6,486,502 | B1 * | 11/2002 | Sheppard et al. | 257/194 |
| 7,956,383 | B2 * | 6/2011 | Kuroda et al. | 257/192 |
| 7,999,286 | B2 * | 8/2011 | Ohta et al. | 257/194 |
| 8,044,434 | B2 * | 10/2011 | Ohta et al. | 257/194 |
| 2001/0040246 | A1 * | 11/2001 | Ishii | 257/192 |
| 2004/0157355 | A1 | 8/2004 | Kachi et al. | |
| 2006/0220060 | A1 | 10/2006 | Nakata et al. | |
| 2008/0079009 | A1 * | 4/2008 | Yaegashi | 257/77 |
| 2008/0105954 | A1 | 5/2008 | Kodama et al. | |
| 2008/0258243 | A1 * | 10/2008 | Kuroda et al. | 257/410 |
| 2008/0308908 | A1 * | 12/2008 | Otake | 257/615 |
| 2009/0057720 | A1 * | 3/2009 | Kaneko | 257/194 |

FOREIGN PATENT DOCUMENTS

| | | |
|---|---|---|
| JP | 2003-068981 | 3/2003 |
| JP | 2004-304174 | 10/2004 |
| JP | 2005-236267 | 9/2005 |
| JP | 2006-286942 A | 10/2006 |
| JP | 2008-053449 | 3/2008 |
| JP | 2008-227356 | 9/2008 |

OTHER PUBLICATIONS

English translation of JP2008-053449 cited in IDS.*

(Continued)

*Primary Examiner* — Matthew Landau
*Assistant Examiner* — Latanya N Crawford
(74) *Attorney, Agent, or Firm* — Venable LLP; Michael A. Sartori; Tamatane J. Aga

(57) ABSTRACT

The semiconductor device includes a GaN-based layered body having an opening and including an n-type drift layer and a p-type layer located on the n-type drift layer, a regrown layer including a channel and located so as to cover the opening, and a gate electrode located on the regrown layer and formed along the regrown layer, wherein the opening reaches the n-type drift layer, and an edge of the gate electrode is not located outside a region of the p-type layer when viewed in plan.

8 Claims, 11 Drawing Sheets

OTHER PUBLICATIONS

Okada et al., "Novel Vertical Heterojunction Field-Effect Transistors with Re-grown AlGaN/GaN Two-Dimensional Electron Gas Channels on GaN Substrates," The Japan Society of Applied Physics, Applied Physics Express, vol. 3, pp. 054201-1-054201-3 (2010).

* cited by examiner

SEMICONDUCTOR DEVICE AND METHOD FOR PRODUCING THE SAME

BACKGROUND OF THE INVENTION

1. Field of the Invention

The present invention relates to a vertical semiconductor device used for high power switching and having good withstand voltage characteristics, and a method for producing the semiconductor device.

2. Description of the Related Art

High reverse breakdown voltage and low on-resistance are required for high current switching elements. Field effect transistors (FETs) that use a group III nitride semiconductor are superior in terms of high breakdown voltage and high-temperature operation because of their large band gap. In particular, vertical transistors that use a GaN-based semiconductor have been receiving attention as transistors for controlling high power. For example, there has been proposed a vertical GaN-based FET whose mobility is increased and whose on-resistance is decreased by forming an opening in a GaN-based semiconductor and forming a regrown layer including a channel of two-dimensional electron gas (2DEG) on the side surface of the opening (refer to Japanese Unexamined Patent Application Publication No. 2006-286942).

SUMMARY OF THE INVENTION

Since the above-described vertical FET has an npn structure, withstand voltage characteristics in a vertical direction can be ensured while achieving high mobility of a channel. However, good withstand voltage characteristics need to be ensured at the edge of a gate electrode as well.

An object of the present invention is to provide a semiconductor device that can achieve, with certainty, high mobility of a channel and withstand voltage characteristics in a vertical direction and at the edge of a gate electrode, and a method for producing the semiconductor device.

The semiconductor device of the present invention is formed on a GaN-based layered body including an n-type drift layer and a p-type layer located on the n-type drift layer. In this semiconductor device, the GaN-based layered body has an opening formed therein, and the semiconductor device includes a regrown layer including a channel and located so as to cover the opening, a gate electrode located on the regrown layer and formed along the regrown layer, a source electrode located on the GaN-based layered body so as to be in contact with the regrown layer, and a drain electrode located so that the drain electrode and the source electrode sandwich the n-type drift layer. The regrown layer includes an electron transit layer and an electron supply layer, and the channel is a two-dimensional electron gas formed at an interface between the electron transit layer and the electron supply layer. The opening reaches the n-type drift layer, and an edge of the gate electrode is not located outside a region of the p-type layer when viewed in plan.

In the above-described structure, on the whole, the gate electrode covers the n-type drift layer that constitutes the bottom surface of the opening, and thus there are some portions where the gate electrode is located outside the region of the p-type layer when viewed in plan. However, the edge of the gate electrode is not located outside the region of the p-type layer when viewed in plan. At the edge of the gate electrode, electric field concentration is easily caused by a surface state, or a fixed charge or an interface state resulting from impurities of a regrown interface. Therefore, at the edge of the gate electrode, the withstand voltage characteristics are more unstable than at a non-edge portion (inner portion). In this semiconductor device, a voltage is applied between the source electrode and the drain electrode in a vertical direction, whereby a current flows. Since a control signal voltage (0 to +10 V) is applied to the gate electrode, a large potential difference is generated between the gate electrode and the drain electrode. Thus, the instability of the withstand voltage characteristics at the edge of the gate electrode leads to the degradation of the withstand voltage characteristics of this semiconductor device. However, as described above, the gate electrode is terminated at a position above the p-type layer located on the n-type drift layer. Therefore, the p-type layer functions as a guard ring structure and good withstand voltage characteristics can be ensured at the edge of the gate electrode. Consequently, the withstand voltage characteristics of this semiconductor can be ensured.

The GaN-based layered body is formed on a predetermined crystal face of a GaN base through epitaxial growth. The GaN base may be a GaN substrate or a GaN film formed on a supporting member. Furthermore, by growing the GaN-based layered body on a GaN substrate or the like and reducing the thickness of the GaN substrate or the like to a certain degree in the step performed later, only a thin base of a GaN layer may be left in a product state. The thin base of a GaN layer may be conductive or nonconductive, and the drain electrode can be formed on a top or bottom surface of the thin GaN layer depending on the production steps and the structure of a product.

When a GaN substrate or a supporting member is left in a product, the supporting member or the substrate may be conductive or nonconductive. In the case of being conductive, a drain electrode can be directly formed on the bottom surface (lower surface) or the top surface (upper surface) of the supporting member or the substrate. In the case of being nonconductive, a drain electrode can be formed on a conductive layer that is located on the lower layer side of the semiconductor layer, the drain electrode being formed above the nonconductive substrate.

The following structure may be employed. The GaN-based layered body includes an n-type outer layer located on the p-type layer; the opening is wider at the upper position thereof and penetrates the p-type layer and the n-type outer layer; the regrown layer extends to a position on the n-type outer layer so as to cover the n-type drift layer exposed in the opening and end surfaces of the p-type layer and the n-type outer layer exposed in the opening; the gate electrode extends up to the regrown layer on the n-type outer layer; and the source electrode is located on the n-type outer layer.

As a result, the regrown layer is formed so as to cover the end surfaces of the n-type outer layer and the p-type layer and the n-type drift layer at the bottom. A channel is formed along the wall surface of the opening, and a large current can be passed in a vertical direction (thickness direction) through the n-type drift layer at high mobility and low on-resistance. This structure is simple and the production is easily performed. A current per unit area is determined depending on the perimeter of the opening per unit area of the GaN-based layered body, that is, the density of the perimeter of the opening. The current per unit area can be increased in proportion to the density of the perimeter. Since the gate electrode is terminated at a position above the p-type layer, good withstand voltage characteristics can be obtained at the edge of the gate electrode.

The following structure may be employed. The semiconductor device is a single chip formed in an area of the GaN-based layered body; a plurality of the openings are formed; the gate electrode formed in each of the openings is electrically connected to a single gate pad or a plurality of gate pads formed for certain regions in the single chip; and the gate electrode including the single gate pad or the plurality of gate pads is not terminated outside a region of the p-type layer when viewed in plan.

On the chip, the edge of the gate electrode including the gate pad is always terminated at a position above the p-type layer. As a result, in the chip, the instability of the withstand voltage characteristics at the edge of the gate electrode is eliminated, and good withstand voltage characteristics can be maintained.

Since this chip is formed in the area of the GaN-based layered body, the portion having no p-type layer is limited to a portion of the bottom of the opening that reaches the n-type drift layer. Therefore, the gate electrode may be terminated so that the edge does not intersect with the opening. In other words, the gate electrode may cover (fill) the entire region of the opening. Since the gate electrode controls the channel inside the regrown layer formed on the wall surface of the opening, the gate electrode has to overlap the wall surface of the opening. To prevent the edge of the gate electrode from intersecting with the bottom of the opening while the gate electrode overlaps the wall surface of the opening, the structure in which the gate electrode covers (fills) the entire region of the opening is employed, which is a very simple structure that allows the edge of the gate electrode to be located within a region of the p-type layer.

An interlayer insulating film may be located so as to cover the gate electrode, and the source electrode may be connected to a conductive layer on the interlayer insulating film through a via hole formed in the interlayer insulating film. This can achieve three-dimensional crossing between the wiring line of the source electrode and the wiring line of the gate electrode without causing the interference therebetween. Thus, a space for these wiring lines can be decreased, and a current per unit area can be increased by densely arranging the openings. Furthermore, since there is no need to draw a wiring line, the electrical resistance can be reduced at the source electrode and the gate electrode. As a result, low on-resistance and high mobility can be achieved.

The p-type layer and the source electrode may be connected to each other through a conductive portion. The potential of the p-type layer can be equalized to that of the source electrode. As a result, the guard ring effect can be improved.

The openings may be arranged in a honeycomb shape or in an elongated shape. This can increase the perimeter of the opening per unit area, and therefore a large current can be easily passed.

The semiconductor device may further include a cap layer located between the regrown layer and the gate electrode so as to cover the regrown layer. In this semiconductor device, the cap layer may be a p-type layer or a layer configured to apply an electric field to the regrown layer using a piezoelectric effect in order to increase the minimum energy of a channel layer of the regrown layer. This can further bring this semiconductor device into a normally-off state with certainty. When the semiconductor device is used as a high-current switching element, it is important to be normally-off operation.

The threshold voltage of the gate voltage is defined as a voltage that provides a lower limit current value of a drain current, for example, $4 \times 10^{-8}$ A or less. The lower limit current value is varied depending on the size of the semiconductor device. Normally-off operation indicates a FET whose threshold voltage is positive. From a microscopic viewpoint, normally-off operation is achieved by increasing the minimum energy of a channel to an energy that is sufficiently higher than Fermi energy while the threshold voltage is applied to a gate.

(C1) The Case where Cap Layer is Piezoelectric Effect Producing Layer

In the regrown layer of the GaN-based semiconductor device, (electron transit layer/electron supply layer) is constituted by, for example, (GaN layer/AlGaN layer). However, at the GaN/AlGaN heterojunction, an internal electric field is generated due to spontaneous polarization and piezoelectric polarization, whereby a high-density sheet carrier is generated at the heterojunction. Since the internal electric field generated by this sheet carrier is oriented in the direction in which the minimum energy of a channel is decreased, it is difficult to realize normally-off operation. In the case where the lattice constant of AlGaN is higher than that of GaN, such a piezoelectric field (internal electric field) that is oriented in a direction in which normally-off operation is inhibited is generated. That is, the above-described channel has a normally-off-inhibiting factor that is unique to the combination of the electron supply layer AlGaN/electron transit layer GaN. However, a piezoelectric electric field that is oriented in a direction in which the internal electric field is canceled is generated using the cap layer to increase the minimum energy of the channel, whereby the sheet carrier can be eliminated.

The piezoelectric effect is produced by distributing distortion through the epitaxial growth of a semiconductor layer having a lattice constant that is lower than that of the AlGaN uppermost layer of the regrown layer. The piezoelectric effect generates an electric field that is oriented in a direction in which the minimum energy of the channel is increased. Examples of such a semiconductor layer include InGaN, GaN, AlGaN, and AlInGaN. By applying an electric field that is oriented in the above-described direction to the channel of the regrown layer, the minimum energy of the channel is increased to an energy that is sufficiently higher than Fermi energy. As a result, the two-dimensional electron gas concentration is sufficiently decreased in the state in which the gate voltage is zero, and thus the drain current value reaches a value that is less than the above-described lower limit current value. In other words, normally-off operation can be realized with certainty.

(C2) The Case where Cap Layer is Constituted by P-Type Layer

By employing a p-type layer as the cap layer, the minimum energy of the two-dimensional electron gas is also increased to an energy that is sufficiently higher than Fermi energy. The p-type layer that forms such a cap layer may be formed on the regrown layer through epitaxial growth or another method. For example, a p-type GaN-based semiconductor can be used. The p-type layer is not necessarily composed of a semiconductor. Obviously, the withstand voltage characteristics of the gate electrode are further improved with certainty by inserting the cap layer constituted by a p-type layer.

The GaN-based layered body may be formed on a GaN-based substrate whose main surface is a {0001} face, and an end surface of the GaN-based layered body exposed in the opening may include a {1-10n} face (n is any constant including zero and infinite). Herein, it is emphatically stated that the constant n includes zero and infinite, but faces corresponding to all constants are not necessarily included. That is, a boundary surface may include only a plurality of equivalent m faces mainly constituted by a {1-100} face or may include other predetermined faces. An example of the predetermined faces may be a {0001} face (c face).

The {1-100} face of GaN or the like is a nonpolar face. For example, in the case where GaN and AlGaN are regrown on the surface of the opening as an electron transit layer and an electron supply layer, respectively, a polarization charge such as a piezoelectric charge is not generated at an AlGaN/GaN heterointerface on the {1-100} face. In addition to the effect of the above-described cap layer, by providing the {1-100} face in most of a region of the boundary surface, normally-off operation can be easily realized in the semiconductor device. From a microscopic viewpoint, the side surface of the opening is inclined stepwise in the depth direction, and a plurality of equivalent m faces or the above-described other faces appear on the stepwise surface. Accordingly, the angle of the side surface of the opening can be freely set. That is, the depth of the opening can be freely set.

The method for producing a semiconductor device of the present invention is a method for producing a semiconductor device that uses a GaN-based layered body. The production method includes a step of forming a GaN-based layered body including an n-type drift layer and a p-type layer located on the n-type drift layer, a step of forming an opening in the GaN-based layered body by etching so that the opening reaches the n-type drift layer, a step of forming a regrown layer including a channel so that the regrown layer covers the opening of the GaN-based layered body, and a step of forming a gate electrode on the regrown layer. In the step of forming the gate electrode, an edge of the gate electrode is formed within a region of the p-type layer when viewed in plan. By this production method, a high-current vertical FET having good withstand voltage characteristics and low on-resistance can be easily produced.

According to the present invention, there can be provided a semiconductor device that can achieve, with certainty, high mobility of a channel, low on-resistance, and good withstand voltage characteristics in a vertical direction and at the edge of a gate electrode.

BRIEF DESCRIPTION OF THE DRAWINGS

FIG. 6A shows the state in which an epitaxial layered body including up to a cap layer is formed on a GaN substrate. FIG. 6B shows the state in which a resist pattern is formed in order to form an opening.

DESCRIPTION OF THE PREFERRED EMBODIMENTS (First Embodiment)

Figure 1:
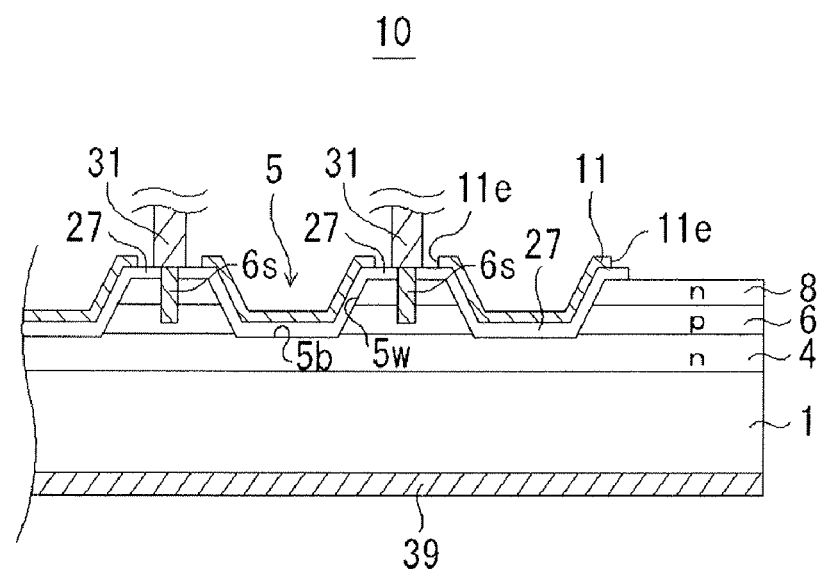
FIG. 1 is a sectional view taken along line I-I of FIG. 3, showing a vertical GaN-based FET according to a first embodiment of the present invention.
Figure 2:
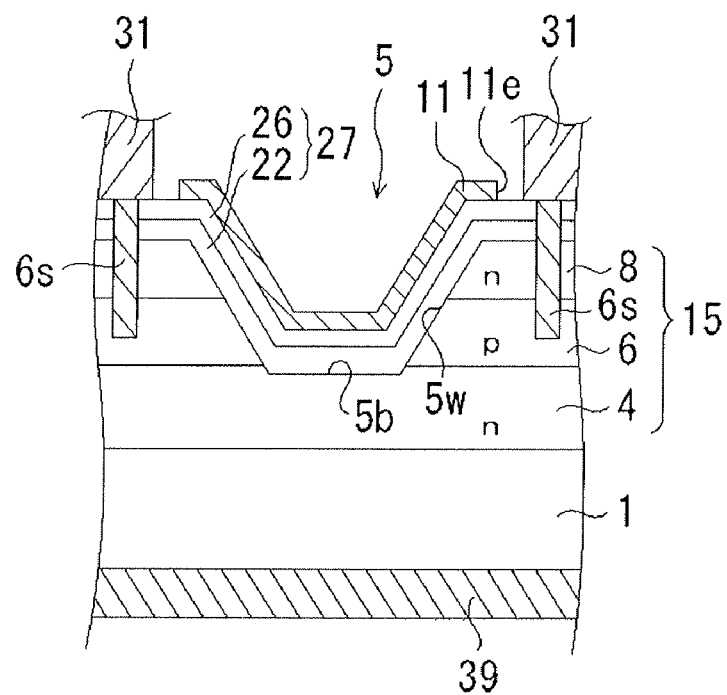
FIG. 2 is an enlarged view of a portion of a regrown layer formed so as to cover a bottom surface and a wall surface of an opening.
Figure 3:
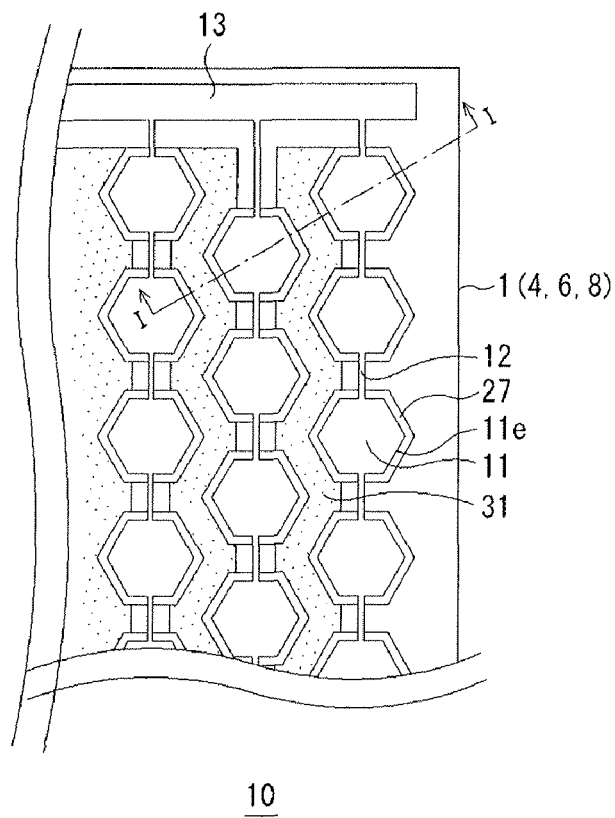
FIG. 3 is a plan view of a corner portion of a chip having the semiconductor device of FIG. 1 formed thereon.

FIG. 1 is a sectional view of a vertical GaN-based FET 10 according to a first embodiment of the present invention. FIG. 2 is an enlarged view of a portion of a regrown layer 27 formed so as to cover a bottom surface 5b and a wall surface 5w of an opening 5. FIG. 3 is a plan view of a chip on which this semiconductor device is formed. The plan view shows in which part the sectional view of FIG. 1 is located on the whole.

This vertical FET 10 includes a GaN substrate 1 (or a substrate 1 having a GaN layer that is formed on a conductive supporting member through ohmic contact), a GaN-based layered body 15, an opening 5, a regrown layer 27, a gate electrode 11 formed on the regrown layer 27, a source electrode 31, and a drain electrode 39. The GaN-based layered body 15 including a p-type layer 6 is formed in the entire region of a chip, only the corner portion of the chip being shown in FIG. 3. The opening 5 is formed in an outer layer portion of the GaN-based layered body 15. The regrown layer 27 is formed along the wall surface 5w of the opening 5 in the GaN-based layered body 15. The source electrode 31 may be formed at a predetermined position on an n-type GaN outer layer 8 or may be formed so as to be in contact with the regrown layer 27. The gate electrode 11 is formed in a depressed portion that follows the shape of the opening 5.

In the GaN-based layered body 15 shown in FIG. 1, a buffer layer is not inserted between the GaN substrate 1 and an n-type drift layer 4, but the buffer layer may be inserted. In the description of the production method below, the case where a buffer layer is inserted is exemplified. As described above, the GaN-based layered body 15 is formed on a predetermined crystal face of a GaN base through epitaxial growth. The GaN base may be a GaN substrate or a GaN film formed on a supporting member. Furthermore, by growing the GaN-based layered body on a GaN substrate or the like and reducing the thickness of the GaN substrate or the like to a certain degree in the step performed later, only a thin base of a GaN layer may be left in a product state. The thin base of a GaN layer may be conductive or nonconductive, and a drain electrode can be formed on a top or bottom surface of the thin GaN layer depending on the production steps and the structure of a product.

When a GaN substrate or a supporting member is left in a product, the supporting member or the substrate may be conductive or nonconductive. In the case of being conductive, a drain electrode can be directly formed on the bottom surface (lower surface) or the top surface (upper surface) of the supporting member or the substrate. In the case of being nonconductive, a drain electrode can be formed on a conductive layer that is located on the lower layer side of the layered body, the drain electrode being formed above the nonconductive substrate. The GaN substrate 1 shown in FIG. 1 is understood as one of a wide range of types of substrates including the GaN substrate described above.

In this vertical FET 10, electrons flow in a vertical direction (thickness direction) from the source electrode 31 to the drain electrode 39 through a GaN electron transit layer 22 in the regrown layer 27, the n-type GaN drift layer 4, and the GaN substrate 1 (refer to FIG. 2). Since a current is passed in a vertical direction (thickness direction), a large current can be passed at low on-resistance.

The GaN-based layered body 15 has a structure of (n-type GaN drift layer 4/p-type GaN barrier layer 6/n-type GaN outer layer 8) stacked on the GaN substrate 1 in that order. In this embodiment, the p-type GaN barrier layer 6 is electrically connected to the source electrode 31 through a conductive portion 6s that is arranged so as to surround each of the openings 5. As is clear from the above description, the opening 5 is formed by removing part of the p-type GaN barrier layer 6 that constitutes the p-type layer. The opening 5 is formed so that the bottom surface 5b reaches the n-type GaN drift layer 4 but does not penetrate the n-type GaN drift layer 4. By arranging the p-type GaN barrier layer 6 around the opening 5, the pinch-off characteristics can be improved due to a back-gate effect. By employing a p-type AlGaN layer instead of the p-type GaN barrier layer 6, a band gap can be further increased and thus the pinch-off characteristics of the vertical FET 10 can be improved.

The p-type barrier layer 6 that constitutes the above-described p-type layer contributes to the realization of normally-off operation due to a back-gate effect, regardless of a GaN layer and an AlGaN layer. As specifically described below, a gate-constituting body such as the gate electrode 11 is terminated at a position above the p-type barrier layer 6, whereby the instability of the withstand voltage characteristic of the gate electrode 11 or the like can be eliminated.

<Feature of this Embodiment>

This embodiment has the following feature. A gate-constituting body including a gate wiring line 12, a gate pad 13, and the gate electrode 11 is terminated at a position above the p-type layer 6 when viewed in plan. That is, any edge of the gate-constituting body is not located outside a region of the p-type layer 6. As a result, the withstand voltage characteristics at the edge of a gate electrode are improved, whereby the withstand voltage characteristics of the entire chip including those in a vertical direction can be ensured with certainty while high channel mobility is achieved. The p-type GaN barrier layer 6 is electrically connected to the source electrode 31 through the conductive portion 6s that is arranged so as to surround each of the openings 5. The p-type GaN barrier layer 6 having a common-source configuration can produce a guard ring effect more stably and thus can further stabilize the withstand voltage characteristics at the edge of a gate electrode.

In this embodiment, specifically, the semiconductor device has the following structure so that the gate-constituting body can be terminated at a position above the p-type layer 6 when viewed in plan.

(K1) The p-type layer 6 is formed in the entire region of a chip. Since the GaN-based layered body 15 is formed on the entire wafer and the wafer is cut into chips, the p-type layer 6 is inevitably formed in the entire region of a chip.

(K2) The gate electrode 11, the gate wiring line 12, and the gate pad 13 are formed so as not to incompletely overlap the opening 5 and a certain removed portion of the p-type layer 6 (if such a portion is present) when viewed in plan. "Not to incompletely overlap" means that, when the gate electrode 11, the gate wiring line 12, and the gate pad 13 intersect with the opening 5 or the like, they thoroughly cover the opening 5 when viewed in plan.

In the case where the certain removed portion of the p-type layer 6 is not present except for the opening 5, this (K2) is realized with certainty by causing the gate electrode 11 to extend to the regrown layer 27 on the n-type outer layer 8 that is located in the periphery of each of the openings 5. That is, the inner portion (non-edge portion) of the gate electrode 11 completely covers (fills) each of the opening 5, and therefore all of the edge 11e of the gate electrode 11, the edge of the gate wiring line 12, and the edge of the gate pad 13 are not located outside the region of the p-type layer 6.

However, when there is a removed portion of the p-type layer 6 in addition to the opening 5, a structure in which the gate-constituting body intersects with the removed portion needs to be avoided. If the gate-constituting body intersects with that portion, the non-edge portion of the gate-constituting body needs to completely cover the removed portion.

Figure 4:
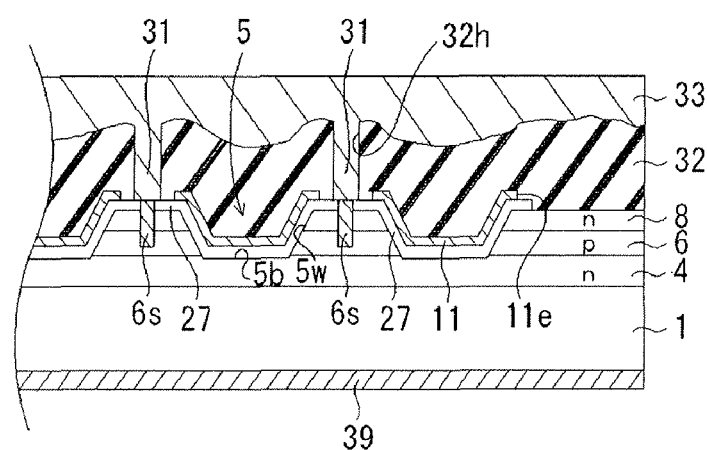
FIG. 4 shows the wiring of a source electrode.

As shown in FIG. 3, the opening 5 and gate electrode 11 are formed so as to have a hexagonal shape, and the periphery thereof is substantially covered with the source electrode 31 while avoiding the gate wiring line 12 to obtain a close-packed structure (honeycomb structure). Therefore, the perimeter of the gate electrode per unit area can be made large, which means that the on-resistance can be reduced. The current flows from the source electrode 31 to the drain electrode 39 through the regrown layer 27 and the n-type drift layer 4. To prevent the interference between the source electrode 31 and the wiring line thereof and the gate-constituting body including the gate electrode 11, gate wiring line 12, and the gate pad 13, a source wiring line is formed on an interlayer insulating film 32 (refer to FIG. 4). As shown in FIG. 4, a via hole 32h is formed in the interlayer insulating film 32, and the source electrode 31 including a plug conductive portion is electrically connected to a source conductive layer 33 formed on the interlayer insulating film 32. In such a structure, the source-constituting body including the source electrode 31 can have low electrical resistance and high mobility, which are suitable for high power elements.

<Wall Surface 5w of Opening 5>

Figure 5:
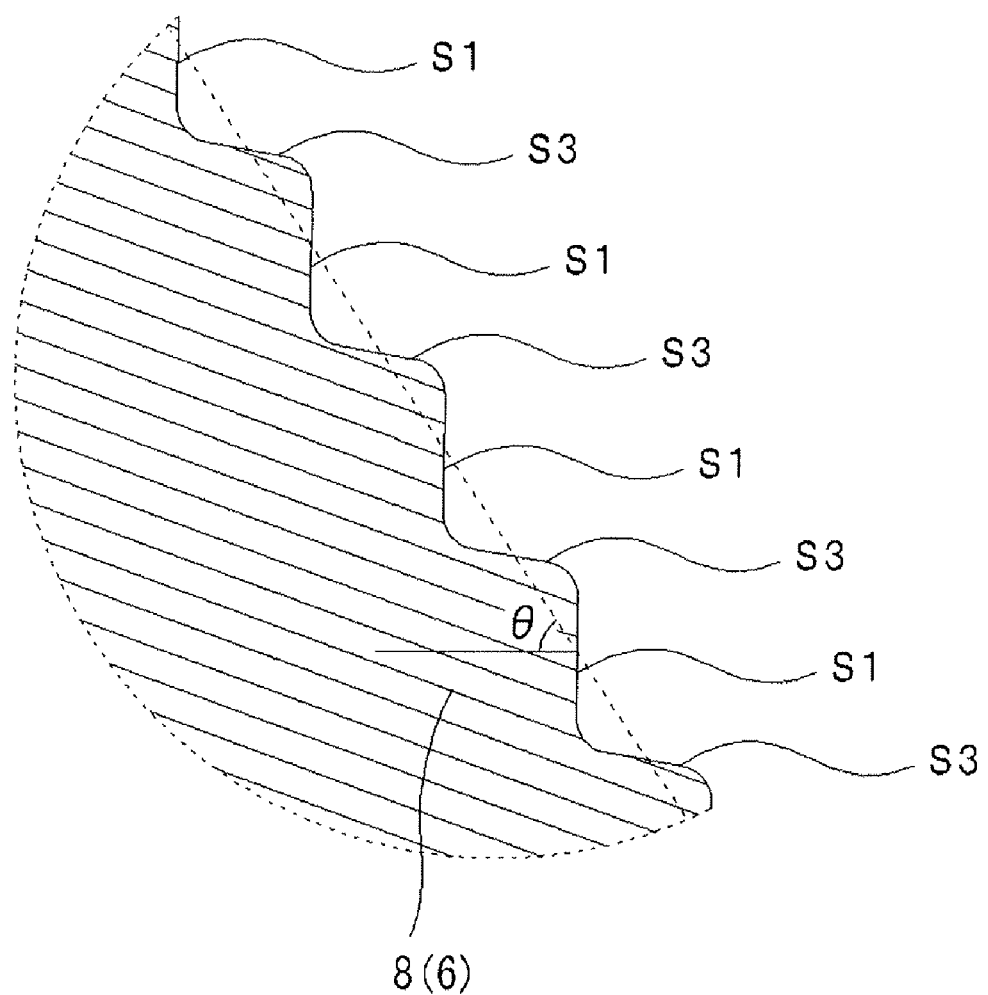
FIG. 5 is an enlarged sectional view of the end surface of an n-type outer layer that constitutes the wall surface of the opening.

FIG. 5 is an enlarged sectional view of the end surface of the n-type outer layer 8 that constitutes the wall surface 5w of the opening 5. As shown in FIG. 5, in the wall surface 5w of the opening 5, a plurality of surfaces S1 that are substantially perpendicular to the substrate surface and a plurality of inclined surfaces S3 that are formed so as to complement the areas between the surfaces S1 are formed in a mixed manner in the inclination direction (at an inclination angle θ) of the wall surface 5w of the opening 5.

In the vertical FET 10, when the GaN substrate 1 whose main surface is a {0001} face is used, a hexagonal GaN layer and an AlGaN layer are grown through epitaxial growth using the {0001} face (hereinafter referred to as "C face") as a growth face. Thus, each of the surfaces S1 on the n-type GaN outer layer 8 is a {1-100} face (hereinafter referred to as "m face"). The m face is a nonpolar face unlike the C face. By regrowing a GaN electron transit layer 22 and an AlGaN electron supply layer 26 using the m face as a growth face, a polarization charge such as a piezoelectric charge is not generated at the heterointerface of AlGaN 26/GaN 22. Therefore, an electric field is not generated in a direction in which the minimum energy of a channel is decreased. This contributes to the realization of normally-off operation in the vertical FET 10.

As the inclination angle θ of the side surface of the opening 5 shown in FIG. 5 approaches 90 degrees, the ratio of the surfaces S1 that occupy the side surface is increased. Thus, to realize normally-off operation in the vertical FET 10, the inclination angle θ is preferably close to 90 degrees and is suitably 60 degrees or more, for example.

<P-Type Barrier Layer 6>

As described above, the p-type GaN barrier layer 6 that constitutes the p-type layer can prevent the withstand voltage characteristics at the edge of the gate-constituting body such as the gate electrode 11 from becoming unstable. The withstand voltage characteristics of the gate electrode 11 can be made more stable by electrically connecting the p-type GaN barrier layer 6 to the source electrode 31. Furthermore, the p-type barrier layer 6 allows threshold voltage to shift in a positive-going direction due to a back-gate effect, and thus can contribute to the realization of normally-off operation. The side surface of the opening 5 on the p-type GaN barrier layer 6 is also the same as that on the n-type GaN outer layer 8 shown in FIG. 5 and includes an m face, which is a nonpolar face.

<Regrown Layer 27>

The regrown layer 27 does not necessarily include any layer between the GaN electron transit layer 22 and the electron supply layer 26, but may include an AlN intermediate layer therebetween. Herein, impurities are not added to the GaN electron transit layer 22. On the other hand, impurities are added to the AlGaN electron supply layer 26. The AlGaN electron supply layer 26 has a band gap larger than that of the GaN electron transit layer 22. Thus, two-dimensional electron gas is formed at the interface between the GaN electron transit layer 22 and the AlGaN electron supply layer 26, whereby the on-resistance can be further reduced. In the case where the AlN intermediate layer is formed, the AlN intermediate layer suppresses the scattering of electrons at the interface between the GaN electron transit layer 22 and the AlGaN electron supply layer 26. This can improve the mobility of electrons in the regrown layer 27. This can further reduce the on-resistance of the vertical FET 10.

As a GaN-based semiconductor, the electron transit layer 22 and the electron supply layer 26 may be made of a crystal or a mixed crystal that is composed of at least one of GaN, AlN, InN, and the like as long as the band gap energy of the electron supply layer 26 is higher than that of the electron transit layer 22. Thus, high mobility can be ensured. In particular, by using GaN or InGaN for the GaN electron transit layer 22 and by using AlGaN for the electron supply layer 26, high mobility can be ensured.

<Production Method>

Figure 6A:
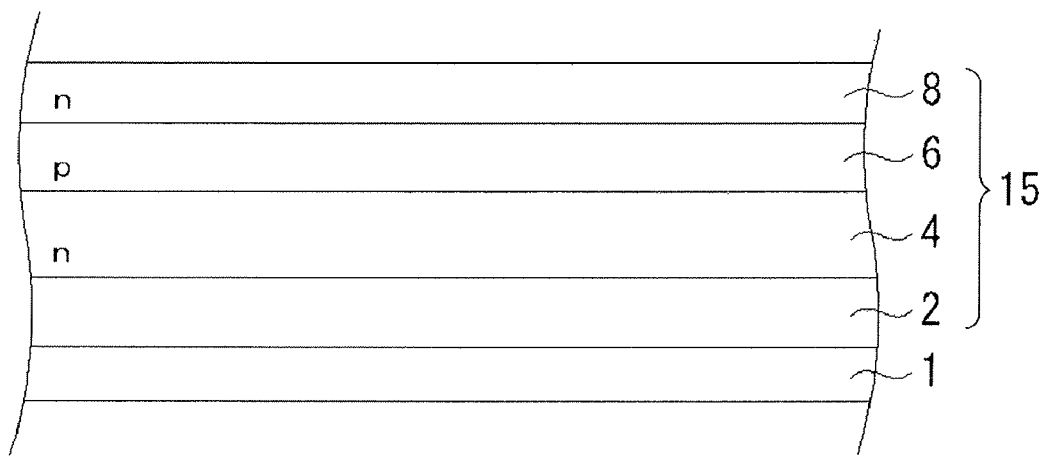
FIGS. 6A and 6B show a method for producing the vertical GaN-based FET of FIG. 1.

A method for producing a semiconductor device according to this embodiment will now be described. First, as shown in FIG. 6A, a GaN-based layered body 15 of buffer layer 2/n-type GaN drift layer 4/p-type GaN barrier layer 6/n-type GaN outer layer 8 is grown on the GaN substrate 1 that is understood as described above through epitaxial growth. These layers are formed by, for example, metal-organic chemical vapor deposition (MOCVD). Alternatively, molecular beam epitaxy (MBE) may be used instead of MOCVD. Thus, a GaN-based layered body having high crystallinity can be formed. The thickness, carrier density, and Al mixed crystal ratio of each of the layers are as follows.

The buffer layer 2 has a thickness of 0.5 μm and a carrier density of $1.0 \times 10^{17}$ cm$^{-3}$.

The n-type GaN drift layer 4 has a thickness of 5.0 μm and a carrier density of $5.0 \times 10^{15}$ cm$^{-3}$.

The p-type GaN barrier layer 6 has a thickness of 0.5 μm and a carrier density of $7.0 \times 10^{17}$ cm$^{-3}$.

The n-type GaN outer layer 8 has a thickness of 0.3 μm and a carrier density of $2.0 \times 10^{18}$ cm$^{-3}$.

Figure 6B:
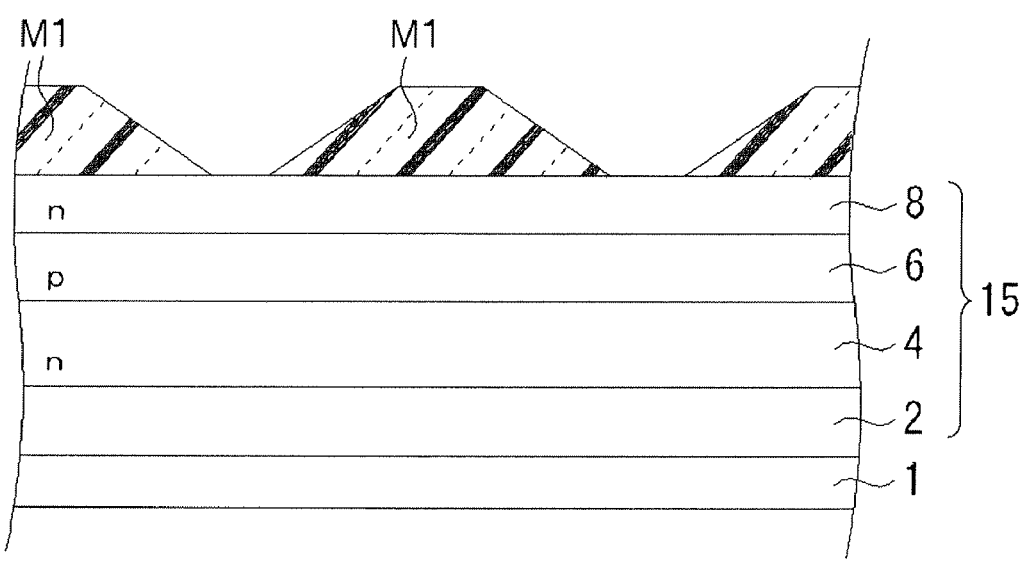

As shown in FIG. 6B, a resist mask pattern M1 is then formed in a predetermined region on the n-type GaN outer layer 8 using a typical exposure technique. In this resist mask pattern M1 formed herein, the planar shape is hexagonal and the sectional shape is trapezoidal (mesa shape).

Figure 7A:
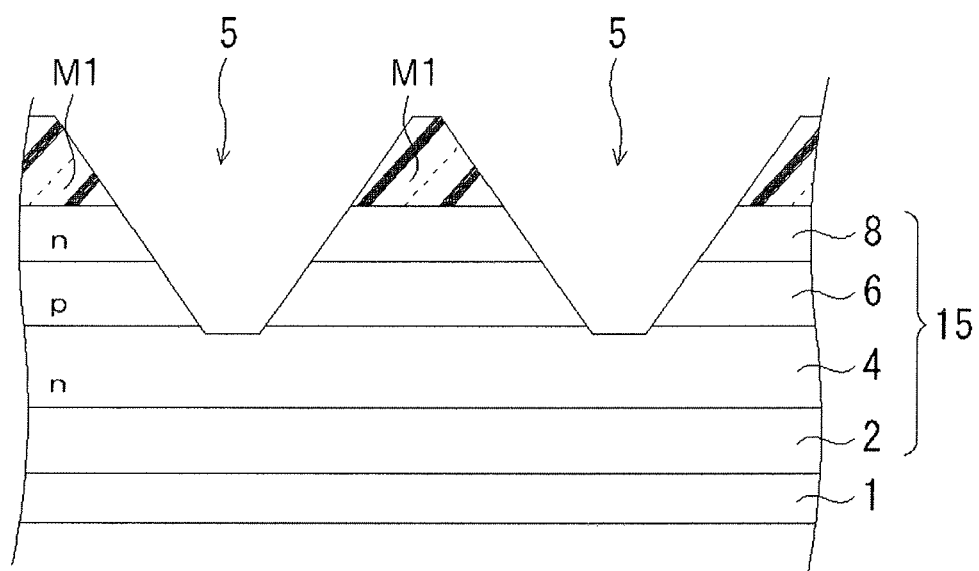
FIG. 7A shows the state in which the opening is formed by etching.

Subsequently, as shown in FIG. 7A, the n-type GaN outer layer 8, the p-type GaN barrier layer 6, and part of the n-type GaN drift layer 4 are etched by reactive ion etching (RIE) that uses high-density plasma generated through inductively coupled plasma, to form an opening 5. As a result, the end surfaces of the n-type GaN outer layer 8, the p-type GaN barrier layer 6, and the n-type GaN drift layer 4 are exposed in the opening 5 and constitute a wall surface 5w of the opening 5. At this point, the side surface of the opening 5 is damaged by etching at a depth of about 1 to 20 nm. The wall surface 5w of the opening 5 is a surface inclined by about 10 to 90° relative to the substrate surface. The angle of the inclined surface relative to the substrate surface can be controlled by adjusting the gas pressure of chlorine gas used in RIE and the flow ratio between the chlorine gas and other gases. After the completion of RIE, washing with an organic solvent is performed and the resist mask M1 is removed by ashing or the like.

Anisotropic wet etching is then performed on the boundary surface of the opening using a tetramethylammonium hydroxide (TMAH) aqueous solution as an etching solution at 80° C. for several minutes to several hours. The damage caused on the boundary surface of the opening by RIE that uses high-density plasma is removed by anisotropic wet etching. At the same time, the m faces of the n-type GaN outer layer 8 and the p-type GaN barrier layer 6 are exposed at part of the end surfaces thereof.

The depth of the damage caused by etching is dependent on the conditions of RIE treatment. The ratio of the m face relative to the wall surface 5w of the opening 5 is dependent on the configuration of the vertical FET 10 produced. Therefore, in consideration of such conditions, the anisotropic etching may be performed under the etching conditions that damage caused by etching is removed and desired characteristics are obtained. The etching solution for anisotropic wet etching is not limited to the TMAH aqueous solution. The etching solution may be suitably selected in accordance with the material of the substrate.

Figure 7B:
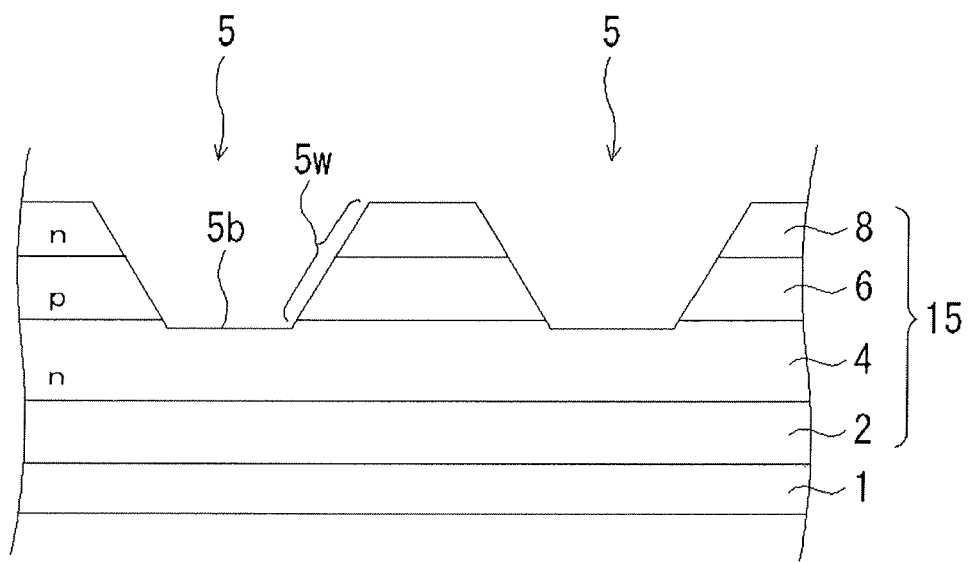
FIG. 7B shows the state in which the resist pattern is removed and the opening is further etched.

The plan view in the state shown in FIG. 7B is substantially similar to a plan view obtained by removing the regrown layer 27 and the gate electrode 11 from the plan view in the state shown in FIG. 3. The planar shape of the opening 5 is hexagonal. The wall surface 5w of the opening 5 is constituted by the end surfaces of the n-type GaN outer layer 8 and the p-type GaN barrier layer 6. The bottom surface 5b of the opening 5 is constituted by the n-type GaN drift layer 4.

Next, a GaN electron transit layer 22 and an AlGaN electron supply layer 26 that constitute the regrown layer 27 are formed along the side surface of the opening 5 (refer to FIGS.

8A and 8B). An AlN intermediate layer may be inserted between the GaN electron transit layer 22 and the AlGaN electron supply layer 26. In the growth of the regrown layer 27, first, a GaN electron transit layer 22 to which impurities are not added is formed by MOCVD. The growth temperature during MOCVD is set to be 1020° C. In the case where the AlN intermediate layer is inserted, the growth temperature is then set to be 1080° C. to form the AlN intermediate layer and the AlGaN electron supply layer 26. Thus, the regrown layer 27 constituted by the electron transit layer 22, the AlN intermediate layer, and the electron supply layer 26 is formed along the surface of the opening 5. For example, the GaN electron transit layer 22 has a thickness of 100 nm, the AlN intermediate layer has a thickness of 1 nm, and the AlGaN electron supply layer 26 has a thickness of 24 nm. The composition ratio of Al in the AlGaN electron supply layer 26 is 25%.

To avoid a decrease in the growth rate on the wall surface 5w of the opening 5, the regrowth is preferably performed at a temperature lower than the growth temperature of the GaN-based layered body 15 and at a high V/III ratio. Furthermore, an increase in the growth temperature from the formation of the electron transit layer 22 to the formations of the intermediate layer and the electron supply layer 26 is preferably performed within a short time to reduce the damage to crystal surfaces. For example, the temperature is preferably increased within 20 minutes. Note that MBE may be used instead of MOCVD.

Figure 8A:
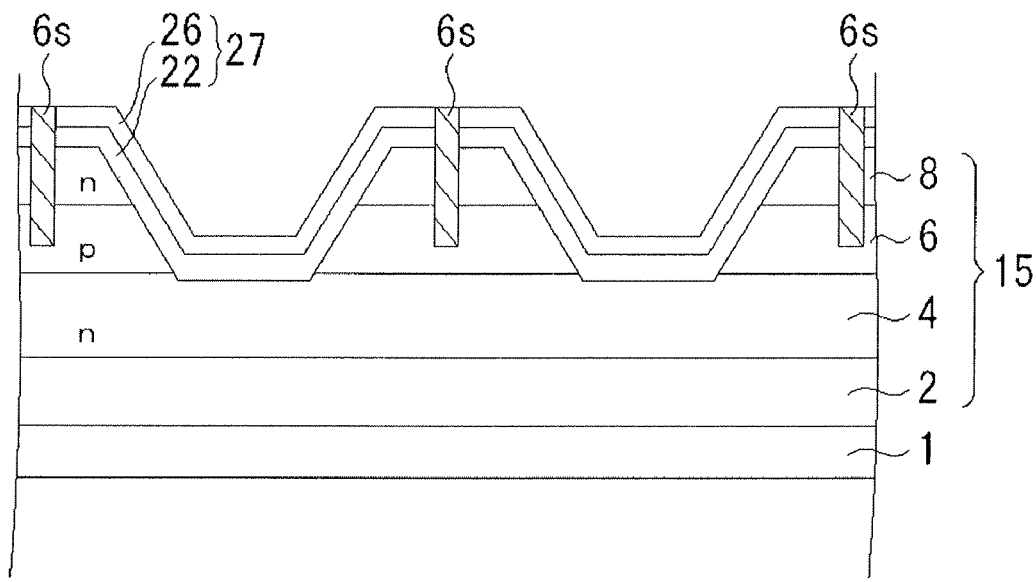
FIG. 8A shows the state in which regrowth is performed on the surface of the opening, a source electrode is formed, and then a resist pattern that covers the source electrode is formed.

Subsequently, a pattern of a conductive portion 6s is formed using a resist by the same formation method as that of the opening 5, and a hole that reaches the p-type GaN layer 6 is formed by dry etching using the resist pattern as a mask. The resist pattern is removed, a new resist pattern is formed, an electrode metal is formed by vapor deposition, and a conductive portion 6s is formed by lift-off (refer to FIG. 8A). Alloy annealing is performed to achieve an ohmic contact between the p-type GaN layer 6 and the conductive portion 6s. The conductive portion 6s has substantially a ring-shaped hexagonal shape excluding a portion of the gate wiring line 12 and is formed so as to follow a source electrode when viewed in plan.

Figure 8B:
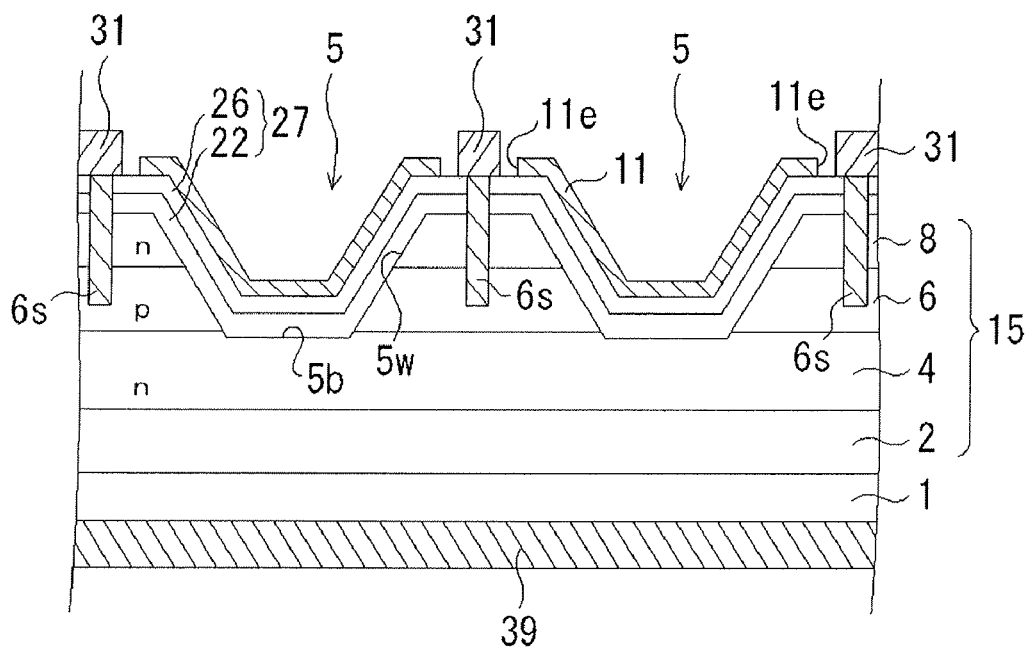
FIG. 8B shows the state in which a gate-constituting body including a gate electrode is formed and then the resist pattern is removed.

A source electrode 31 is then formed. In the formation of the source electrode 31, first, a resist mask pattern having an opening at a position of the source electrode 31 is formed by a typical exposure technique, the position including the top surface of the conductive portion 6s. A source electrode 31 that is a Ti/Al film is then formed on the surfaces of the conductive portion 6s and the regrown layer 27 (refer to FIG. 8B). Subsequently, heat treatment is performed in a nitrogen atmosphere at 800° C. for 30 seconds. This heat treatment may be omitted, and instead the heat treatment performed later in a drain electrode formation step may be used. Through this heat treatment, an alloy layer is formed at the interface between the Ti/Al film and the n-type GaN outer layer 8. As a result, a source electrode 31 having a satisfactory ohmic contact of about 0.4 Ωmm can be formed. Instead of Ti/Al, any metal can be used for the source electrode 31 as long as the metal is formed on the regrown layer 27 through ohmic contact. Before the Ti/Al is formed as a source electrode S by vapor deposition, the AlGaN electron supply layer 26 and the AlN intermediate layer are preferably removed by RIE that uses chlorine gas. In this case, there is no barrier to electrons by the intermediate layer, and thus the resistance at ohmic contact can be reduced to 0.2 Ωmm.

In the formation of a drain electrode 39, first, a wafer surface is protected with a photoresist. A Ti/Al film is formed on the bottom surface of the GaN substrate 1 by vapor deposition. The photoresist on the wafer surface is removed by oxygen ashing. By performing heat treatment at 850° C. for 30 seconds, the substrate 1 including a GaN layer and a metal of the drain electrode 39 is made to form an alloy so that the GaN substrate 1 and the drain electrode 39 are in ohmic contact with each other (refer to FIG. 8B).

In the formation of the gate electrode 11, first, a photoresist having a predetermined opening is formed by a typical exposure technique. A Ni/Au film is then formed along the regrown layer 27, which has been formed in the opening 5, by vapor deposition and lift-off (refer to FIG. 8B). The gate wiring line 12 and the gate pad 13 shown in FIG. 3 are also desirably formed at this point. Instead of the Ni/Au film, a metal that forms a Schottky junction with a GaN-based semiconductor such as Pt/Au, Pd/Au, or Mo/Au may also be used for the gate electrode 11. Before the formation of the gate electrode 11, an insulating film (not shown) composed of, for example, silicon oxide may be formed along the regrown layer 27 in the opening 5 by CVD or sputtering so as to have a thickness of 10 nm. This can also provide a vertical FET having a metal-insulator-semiconductor heterostructure field-effect transistor (MIS-HFET) structure. Instead of the silicon oxide film, a silicon nitride film or an aluminum oxide film may be used as the insulating film.

Figure 9A:
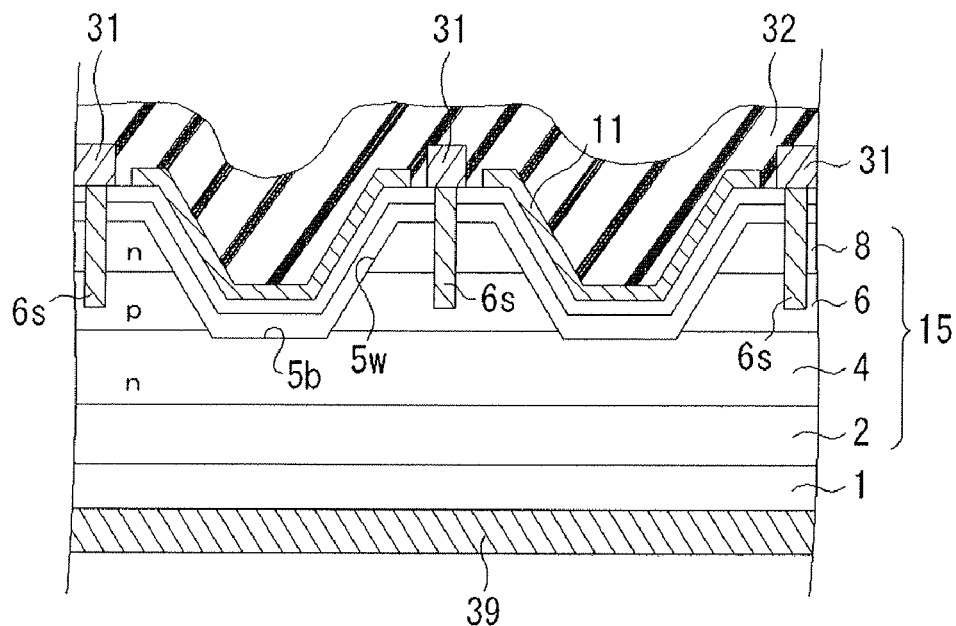
FIG. 9A shows the state in which an interlayer insulating film is deposited.
Figure 9B:
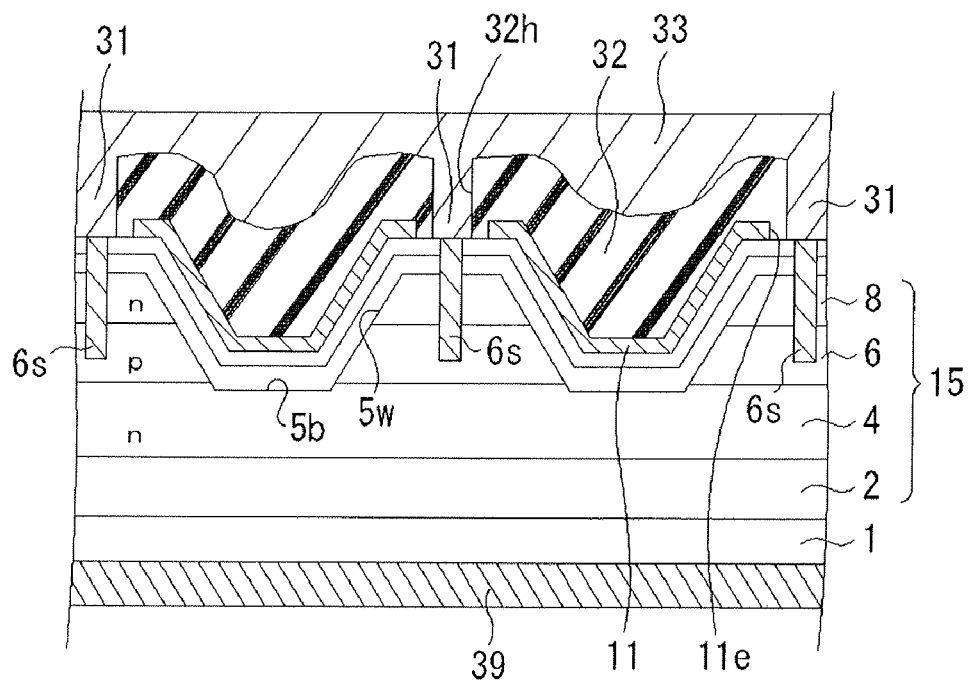
FIG. 9B shows the state in which a via hole is formed in the interlayer insulating film on the source electrode and a source conductive layer electrically connected to the source electrode is formed.

As shown in FIG. 9A, an interlayer insulating film 32 is deposited to form wiring for the source electrode 31 on a layer different from that of the gate electrode 11. Subsequently, a via hole 32h is formed in the interlayer insulating film 32 on the source electrode 31, and a source conductive layer 33 is formed on the interlayer insulating film 32 while filling the via hole 32h.

Through the steps described above, the vertical FET 10 shown in FIG. 1 is completed.

Although the drain electrode 39 is formed on the bottom surface of the GaN substrate 1, the drain electrode 39 may be formed on a surface of the n-type GaN drift layer 4, the surface facing the source electrode 31. For example, an n-type GaN contact layer is formed between the n-type GaN drift layer 4 and the GaN substrate 1, and a drain electrode connected to the contact layer from the surface side can be formed.

(Modification of First Embodiment)

Figure 10:
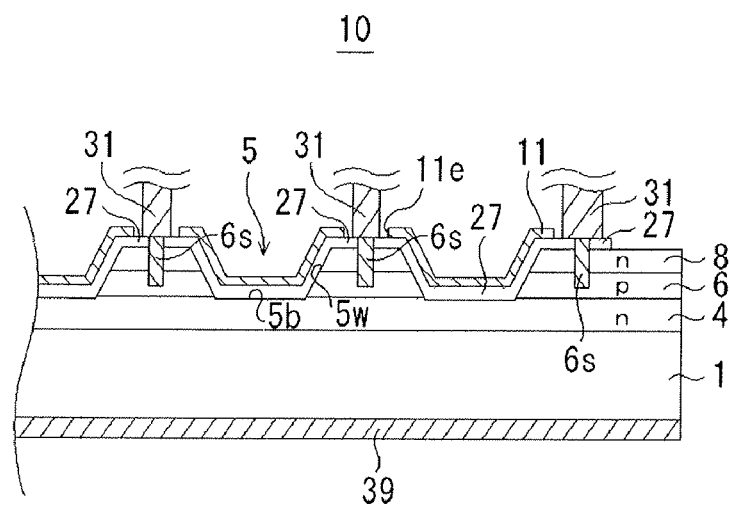
FIG. 10 is a sectional view showing a vertical GaN-based FET that is a modification of the first embodiment and is also an example of the present invention.
Figure 11:
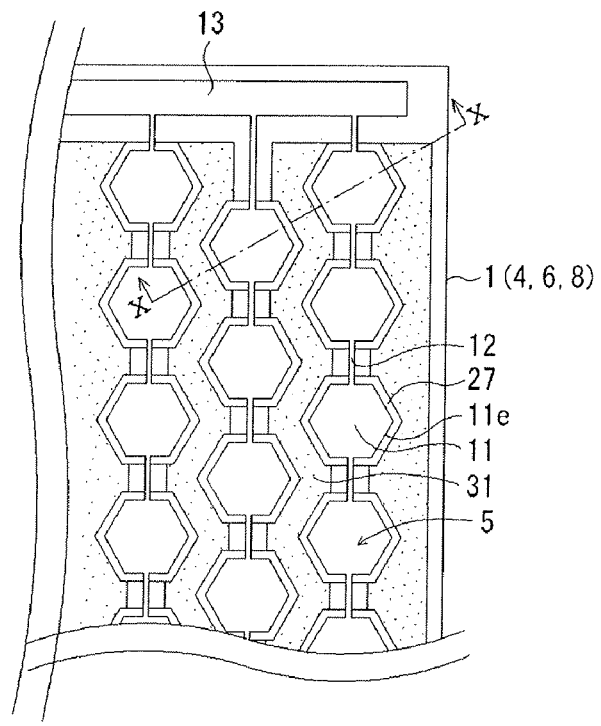
FIG. 11 is a plan view of a corner portion of a chip of the vertical GaN-based FET shown in FIG. 10.

FIG. 10 is a sectional view showing a vertical GaN-based FET 10 that is a modification of the first embodiment and is also an example of the present invention. A source wiring line and the like are omitted. FIG. 11 is a plan view showing the corner portion of the chip. FIG. 10 is a sectional view taken along line X-X of FIG. 11. The semiconductor device of this modification has a feature of forming a source electrode 31 outside the openings 5 located in the periphery of the chip. In the semiconductor device of the first embodiment shown in FIGS. 1 and 3, a source electrode 31 is not formed outside the openings 5 located in the periphery of the chip. A source electrode is not formed on the right side of the openings 5 located at the right edge of FIG. 1. Therefore, a current does not flow through a channel corresponding to that region, or only a low-density current that comes from a source electrode in other region flows. In contrast, in this modification, since a source electrode 31 is formed outside the openings 5 located in the periphery so as to be in contact with a channel, a current can be passed even in the periphery of the chip. As a result, despite a device having a small size, a large current can be passed at low on-resistance.

(Second Embodiment)

Figure 12:
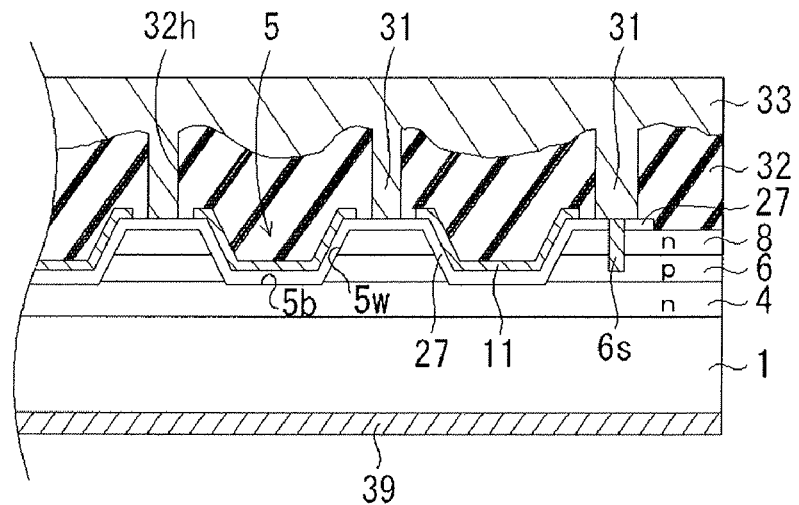
FIG. 12 is a sectional view showing a vertical GaN-based FET according to a second embodiment of the present invention.

FIG. 12 is a sectional view of a semiconductor device according to a second embodiment of the present invention. The semiconductor device of this embodiment has a feature in which the source electrode 31 and the p-type layer 6 are electrically connected to each other through one conductive portion 6s located in the periphery of the chip. In the semiconductor device of the first embodiment, the substantially ring-shaped hexagonal conductive portion 6s is formed around each of the openings 5 so as to follow the source electrode 31. However, in this embodiment, the source electrode 31 and the p-type layer 6 are electrically connected to each other through one conductive portion 6s that is connected to any one of the source electrode 31 in a single chip. For example, by forming one conductive portion 6s in the periphery of the chip, a simple source-common structure of the p-type layer 6 can be obtained. Thus, a semiconductor device can be produced through simple production steps. Even in such a simple structure, by equalizing the potential of the p-type layer 6 with that of the source electrode 31, the withstand voltage characteristics at the edge 11e of the gate electrode 11 can be highly stabilized.

(Third Embodiment)

Figure 13:
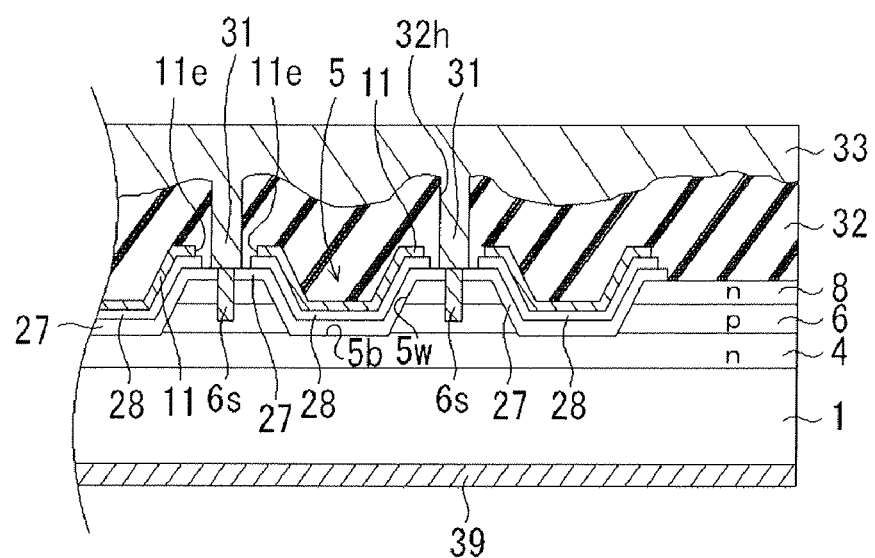
FIG. 13 is a sectional view showing a vertical GaN-based FET according to a third embodiment of the present invention.

FIG. 13 is a sectional view of a semiconductor device according to a third embodiment of the present invention. The semiconductor device of this embodiment has a feature in which a cap layer 28 is formed between the regrown layer 27 and the gate electrode 11. An i-GaN layer having a lattice constant smaller than that of the AlGaN electron supply layer 26 in the regrown layer 27 is used for the cap layer 28. The cap layer 28 is not limited to the i-GaN layer as long as the cap layer is formed on the AlGaN layer 26 through epitaxial growth and has a lattice constant smaller than that of the AlGaN layer 26. An InGaN layer, an AlGaN layer having a small lattice constant, or an AlInGaN layer can also be used. Furthermore, if an electric field is generated, the cap layer is not necessarily formed on the AlGaN layer 26 through epitaxial growth.

Figure 14:
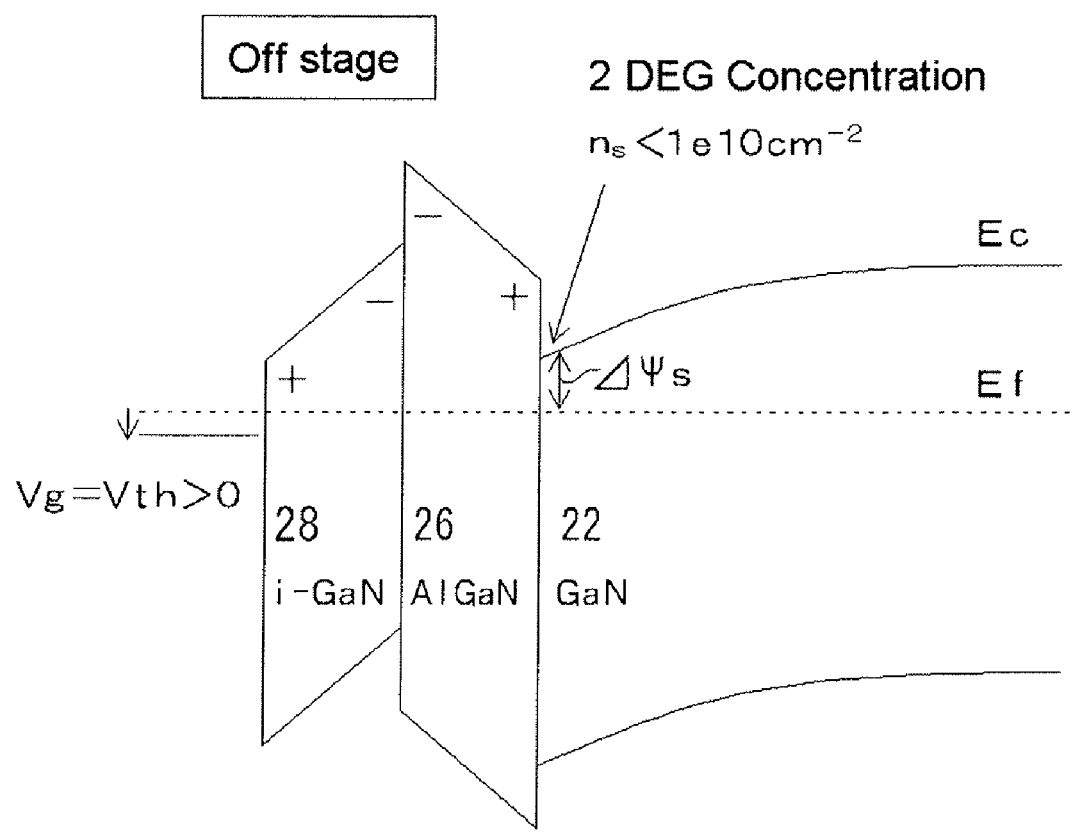
FIG. 14 is an energy band diagram obtained when spontaneous polarization is generated due to the cap layer and thus a piezoelectric field is generated in the vertical GaN-based FET of FIG. 13.

FIG. 14 shows the case where the cap layer 28 is an i-GaN layer, and the difference in a lattice constant causes spontaneous polarization and thus a piezoelectric field is generated. As shown in FIG. 14, the piezoelectric field of the cap layer 28 is oriented in a direction opposite to that of the electric field generated in the AlGaN electron supply layer 26. Consequently, the minimum energy of the channel, that is, the minimum energy of the conduction band Ec of the electron transit layer 22 becomes higher than Fermi energy Ef by $\Delta\Psi s$. Therefore, the 2DEG concentration $n_s$, which is an electron concentration of two-dimensional electron gas that is a channel formed at the interface between the GaN electron transit layer 22 and the AlGaN electron supply layer 26 in the regrown layer 27, can be set to be less than $1 \times 10^{10}/cm^2$, for example.

In the case where i-GaN or the like is used for the cap layer 28, since the cap layer 28 is formed on the AlGaN electron supply layer 26 through epitaxial growth, the cap layer 28 can also be included in the regrown layer 27. However, in principle, the cap layer 28 is not necessarily formed through epitaxial growth and needs only to generate an opposite electric field. Therefore, the cap layer 28 is treated as a layer different from the regrown layer 27.

The cap layer 28 can be formed as a piezoelectric field generating layer as described above, but can also be formed as a p-type cap layer.

In the case of a conventional normally-on FET that does not include a cap layer 28, the threshold voltage $V_{th}$ is less than zero. In the state in which the gate voltage is zero, the minimum energy of the channel, that is, the minimum energy of the conduction band Ec of the electron transit layer 22 is lower than Fermi energy Ef and thus electrons naturally flow into the channel. Therefore, the 2DEG concentration $n_s$ is more than $1 \times 10^{10}/cm^2$. Consequently, the drain current $I_D$ significantly exceeded the above described weak current limit value $I_{th}$. In other words, the FET was on-state in the state in which the gate voltage was zero. To bring the FET into off-state, the gate voltage had to be a negative potential. In particular, the threshold voltage of the normally-on FET is negative. By setting the gate voltage to be the threshold voltage (negative potential), the minimum energy of the channel becomes higher than Fermi energy Ef by $\Delta\Psi s$, whereby the 2DEG concentration $n_s$ becomes less than $1 \times 10^{10}/cm^2$. In this embodiment, a certain level or higher of the difference between the minimum energy of the channel and Fermi energy Ef is achieved using the cap layer 28 that generates an opposite electric field, whereby the 2DEG concentration is reduced and thus normally-off operation is promoted.

(Fourth Embodiment)

Figure 15A:
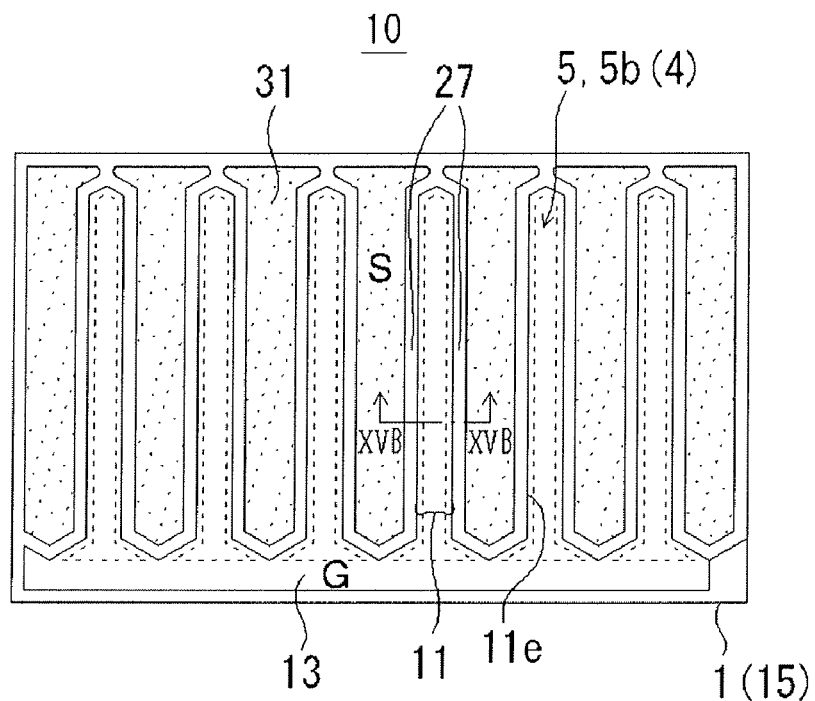
FIG. 15A is a plan view showing a vertical GaN-based FET according to a fourth embodiment of the present invention.
Figure 15B:
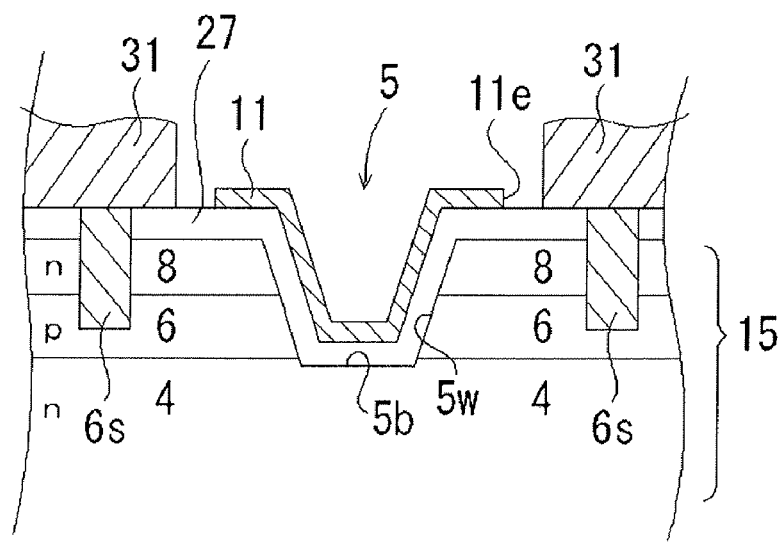
FIG. 15B is a sectional view taken along line XVB-XVB of FIG. 15A.

FIG. 15A is a plan view of a semiconductor device according to a fourth embodiment of the present invention. FIG. 15B is a sectional view taken along line XV-XV of FIG. 15A. In this embodiment, source electrodes 31 and gate electrodes 11 interdigitate with each other in a comb-shaped manner. Each of openings 5 is an elongated depression, and an n-type drift layer 4 is exposed at the bottom surface 5b of the opening 5. A regrown layer 27 extends to a position above an n-type outer layer 8 so as to cover the bottom surface 5b and a wall surface 5w of the elongated opening and be in contact with a source electrode 31. The gate electrode 11 covers a regrown layer 27 so as to follow the shape of the regrown layer 27 and extends to a position above the n-type outer layer 8. As shown in FIG. 15B, the edge 11e of the gate electrode 11 is located above a p-type layer 6 when viewed in plan. A GaN-based layered body 15 including the p-type layer 6 is formed across the GaN substrate 1 that is understood as described above so that the edge of the GaN-based layered body 15 is exposed at the end surface of the GaN substrate 1. Thus, the edge of a gate pad 13 is also located above the p-type layer 6. A conductive portion 6s is located around the center of the source electrode 31 in a width direction, extends in the direction in which the source electrode 31 extends, and electrically connects the source electrode 31 to the p-type layer 6. The source electrode 31 is formed to be as long as possible along the gate electrode 11 so that the portion of the source electrode 31 in the thickness direction faces the portion of the gate electrode 11 in the thickness direction with a space therebetween. Although not shown in FIG. 15B, the source electrode 31 receives a current from a source conductive layer 33 formed on an interlayer insulating film 32 as shown in FIG. 4.

In the above-described structure, the elongated openings 5 are formed and the gate electrodes 11 extend in a comb-shaped manner so as to cover the openings 5. The source electrodes 31 are formed in a comb-shaped or strip-shaped manner between the comb teeth of the gate electrodes 11. The width of the elongated openings 5 and the pitch between the elongated openings 5 may be any. By decreasing the width of the elongated openings 5 and the pitch between the elongated openings 5, the length of the channel of a chip or the perimeter of each of the openings 5 per unit area can be increased. As a result, in the case where it is difficult to employ a honeycomb structure, a chip for large current can be downsized by using the above-described elongated openings 5. As described above, a gate-constituting body including the gate electrode 11 and the gate pad 13 is terminated at a position above the p-type layer 6 having a common-gate configuration, whereby the withstand voltage characteristics of the gate-constituting body can be stabilized.

(Other Embodiments)

In the first to fourth embodiments, there have been described preferable examples in which the p-type layer and the source electrode are electrically connected to each other so as to have the same potential to improve the stability of the withstand voltage characteristics at the edge of the gate electrode. However, in other embodiments of the present invention, the p-type layer is not necessarily electrically connected to the source electrode.

The structures of the embodiments of the present invention disclosed above are mere examples, and the scope of the present invention is not limited to the above description. It is to be understood that the scope of the present invention is defined in the appended claims and includes equivalence of the description of the claims and all changes within the scope of the claims.

According to the present invention, a regrown layer including a channel is formed on the side surface of an opening and a gate electrode is formed on the channel so as to be terminated on a p-type barrier layer, whereby the withstand voltage characteristics of the gate electrode can be improved. Consequently, a normally-off semiconductor device for large current having low on-resistance can be obtained while achieving good withstand voltage characteristics.

What is claimed is:

1. A semiconductor device formed on a GaN-based layered body having an opening and including an n-type drift layer and a p-type layer located on the n-type drift layer, the semiconductor device comprising:
   a regrown layer including a channel and located on the GaN-based layered body so as to cover the opening;
   a gate electrode located on the regrown layer and formed along the regrown layer;
   a source electrode located on the regrown layer, wherein the regrown layer separates the source electrode from the GaN-based layered body;
   a conductive portion to electrically connect the p-type layer and the source electrode; and
   a drain electrode located so that the drain electrode and the source electrode sandwich the n-type drift layer,
   wherein the regrown layer includes an electron transit layer and an electron supply layer,
   the channel is a two-dimensional electron gas formed at an interface between the electron transit layer and the electron supply layer,
   the opening reaches the n-type drift layer, and
   an edge of the gate electrode is not located outside a region of the p-type layer when viewed in plan.

2. The semiconductor device according to claim 1,
   wherein the GaN-based layered body includes an n-type outer layer located on the p-type layer,
   the opening is wider at the upper position thereof and penetrates the p-type layer and the n-type outer layer,
   the regrown layer extends to a position on the n-type outer layer so as to cover the n-type drift layer exposed in the opening and end surfaces of the p-type layer and the n-type outer layer exposed in the opening,
   the gate electrode extends up to the regrown layer on the n-type outer layer, and
   the source electrode is located on the n-type outer layer.

3. The semiconductor device according to claim 1,
   wherein the semiconductor device is a single chip formed in an area of the GaN-based layered body,
   a plurality of the openings are formed,
   the gate electrode formed in each of the openings is electrically connected to a single gate pad or a plurality of gate pads formed for certain regions in the single chip, and
   the gate electrode including the single gate pad or the plurality of gate pads is not terminated outside a region of the p-type layer when viewed in plan.

4. The semiconductor device according to claim 1, wherein the GaN-based layered body comprises a plurality of openings arranged in a honeycomb shape or in an elongated shape.

5. The semiconductor device according to claim 1, further comprising:
   a cap layer located between the regrown layer and the gate electrode so as to cover the regrown layer,
   wherein the cap layer is a p-type layer or a layer configured to apply an electric field to the regrown layer using a piezoelectric effect in order to increase a minimum energy of a channel layer of the regrown layer.

6. The semiconductor device according to claim 1,
   wherein the GaN-based layered body is formed on a GaN-based substrate whose main surface is a $\{0001\}$ face, and
   an end surface of the GaN-based layered body exposed in the opening includes a $\{1\text{-}10n\}$ face (n is any constant including zero and infinite).

7. The semiconductor device according to claim 3,
   wherein an interlayer insulating film is located so as to cover the gate electrode, and
   the source electrode is connected to a conductive layer on the interlayer insulating film through a via hole formed in the interlayer insulating film.

8. A method for producing a semiconductor device comprising:
   a step of forming a GaN-based layered body including an n-type drift layer and a p-type layer located on the n-type drift layer;
   a step of forming an opening in the GaN-based layered body by etching so that the opening reaches the n-type drift layer;
   a step of forming a regrown layer including a channel so that the regrown layer covers the opening of the GaN-based layered body;
   a step of forming a gate electrode on the regrown layer;
   a step of forming a source electrode on the regrown layer, wherein the regrown layer separates the source electrode from the GaN-based layered body; and
   a step of forming a conductive portion to electrically connect the p-type layer and the source electrode to each other,
   wherein in the step of forming the gate electrode, an edge of the gate electrode is formed within a region of the p-type layer when viewed in plan.

* * * * *